US012150238B2

(12) United States Patent
Ryu

(10) Patent No.: US 12,150,238 B2
(45) Date of Patent: Nov. 19, 2024

(54) ELECTRONIC DEVICE INCLUDING SHIELDING MEMBER AND HEAT RADIATING STRUCTURE

(71) Applicant: Samsung Electronics Co., Ltd., Suwon-si (KR)

(72) Inventor: Wansang Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 111 days.

(21) Appl. No.: 17/945,584

(22) Filed: Sep. 15, 2022

(65) Prior Publication Data

US 2023/0127318 A1    Apr. 27, 2023

Related U.S. Application Data

(63) Continuation of application No. PCT/KR2022/013694, filed on Sep. 14, 2022.

(30) Foreign Application Priority Data

Oct. 25, 2021    (KR) .................. 10-2021-0142975

(51) Int. Cl.
*H05K 1/02*        (2006.01)
*H04N 23/51*       (2023.01)

(52) U.S. Cl.
CPC ........... *H05K 1/0209* (2013.01); *H04N 23/51* (2023.01); *H05K 1/0216* (2013.01)

(58) Field of Classification Search
CPC ............. H05K 1/0209; H05K 1/0216; H05K 7/20445; H05K 9/0024; H04N 23/51; H04N 23/52; G06F 1/203

USPC ......................................................... 348/373
See application file for complete search history.

(56) References Cited

U.S. PATENT DOCUMENTS

| 7,061,099 B2 | 6/2006 | Lu et al. | |
| 8,077,479 B2 | 12/2011 | Ligtenberg | |
| 9,735,826 B2 | 8/2017 | Sohn et al. | |
| 2014/0293119 A1* | 10/2014 | Hamano | H04N 23/672 348/350 |
| 2018/0094831 A1* | 4/2018 | Hertgers | F28D 9/0093 |
| 2018/0220525 A1 | 8/2018 | Chen et al. | |
| 2020/0137931 A1 | 4/2020 | Lee et al. | |
| 2021/0029853 A1 | 1/2021 | Kim et al. | |

(Continued)

FOREIGN PATENT DOCUMENTS

KR            101590130 B1 *  2/2016
KR      10-2016-0057106 A     5/2016
(Continued)

OTHER PUBLICATIONS

International Search Report dated Jan. 4, 2023, issued in an International Application No. PCT /KR2022/013694.

*Primary Examiner* — Usman A Khan
(74) *Attorney, Agent, or Firm* — Jefferson IP Law, LLP

(57) ABSTRACT

An electronic device is provided. The electronic device includes a housing, a printed circuit board disposed in the housing, a first electronic component and/or a second electronic component disposed on the printed circuit board, a shielding member disposed to surround the first electronic component and/or the second electronic component, and a first thermal diffusion member configured to surround at least a portion of a first surface of the shielding member.

19 Claims, 7 Drawing Sheets

(56) References Cited

U.S. PATENT DOCUMENTS

| | | | |
|---|---|---|---|
| 2021/0029855 A1* | 1/2021 | Yoon | ........................ H01L 23/42 |
| 2021/0044681 A1 | 2/2021 | Park et al. | |
| 2021/0068244 A1 | 3/2021 | Jung | |

FOREIGN PATENT DOCUMENTS

| | | | |
|---|---|---|---|
| KR | 10-2019-0106187 A | | 9/2019 |
| KR | 10-2020-0049392 A | | 5/2020 |
| KR | 10-2021-0012533 A | | 2/2021 |
| KR | 10-2021-0012835 A | | 2/2021 |
| KR | 10-2021-0027975 A | | 3/2021 |

* cited by examiner

ELECTRONIC DEVICE INCLUDING SHIELDING MEMBER AND HEAT RADIATING STRUCTURE

CROSS-REFERENCE TO RELATED APPLICATION(S)

This application is a continuation application, claiming priority under § 365(c), of an International application No. PCT/KR2022/013694, filed on Sep. 14, 2022, which is based on and claims the benefit of a Korean patent application number 10-2021-0142975, filed on Oct. 25, 2021, in the Korean Intellectual Property Office, the disclosure of which is incorporated by reference herein in its entirety.

TECHNICAL FIELD

The disclosure relates to an electronic device including a shielding member and a heat-radiating structure.

BACKGROUND ART

There has been increasing use of electronic devices such as smartphones, laptops, or tablet personal computers (PCs).

The electronic devices may include a printed circuit board (PCB) on which various electronic components are disposed.

Electronic components such as an application processor (AP), a communication processor (CP), a power management integrated circuit (PMIC), and/or a radio link control (RLC) element may be disposed on the PCB.

The degree of integration of electronic components disposed on the PCB may increase such that the electronic devices provide various functions to users.

The above information is presented as background information only to assist with an understanding of the disclosure. No determination has been made, and no assertion is made, as to whether any of the above might be applicable as prior art with regard to the disclosure.

DISCLOSURE

Technical Problem

Heat may be generated by an electronic device having various electronic components (for example, processor, power management integrated circuit (PMIC), and/or radio link control (RLC) element) integrated on a printed circuit board (PCB) with a high density.

The performance of the electronic device may be degraded, or the electronic device may fail to operate normally, if the electronic device fails to diffuse and radiate heat generated by the electronic components disposed on the PCB to other areas.

As electronic devices tend to have more complicated functions and to exhibit higher performances, the clock frequency for driving an electronic component such as a processor, for example, and the data transmission rate may gradually increase. In this case, electromagnetic interference (EMI) and noise interference (for example, radio frequency interference (RFI)) occurring in the electronic devices may degrade the performance of the electronic devices.

As the electronic devices have high-performance electronic components (for example, processor, PMIC) and consume more electric currents, at least one capacitor, for example, may be disposed around the electronic components such that the electronic components operate stably. In this case, if a large difference in power ripple occurs according to the amount of power of the PMIC, at least one capacitor disposed on the PCB vibrates, thereby generating audible noise in a specific frequency band.

Aspects of the disclosure are to address at least the above-mentioned problems and/or disadvantages and to provide at least the advantages described below. Accordingly, an aspect of the disclosure is to provide an electronic device capable of blocking electromagnetic interference generated by an electronic component disposed on a PCB, improving heat radiation, or reducing audible noise.

Technical problems to be solved by the disclosure are not limited to the above-mentioned technical problems, and other technical problems not mentioned herein will be clearly understood from the following description by those skilled in the art to which the disclosure pertains.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing, a printed circuit board disposed in the housing, a first electronic component and/or a second electronic component disposed on the printed circuit board, a shielding member disposed to surround the first electronic component and/or the second electronic component, and a first thermal diffusion member configured to surround at least a portion of a first surface of the shielding member.

In accordance with another aspect of the disclosure, an electronic device is provided. The electronic device includes a housing, a printed circuit board disposed in the housing, a first electronic component and/or a second electronic component disposed on the printed circuit board, a shielding member disposed to surround the first electronic component and/or the second electronic component, a first thermal diffusion member surrounding at least a portion of a first surface of the shielding member, and an insulation member surrounding at least a portion of a second surface of the shielding member.

In accordance with another aspect of the disclosure, an electronic device is provided. The electronic device includes a housing, a printed circuit board disposed in the housing, a first electronic component and/or a second electronic component disposed on the printed circuit board, a shielding member disposed to surround the first electronic component and/or the second electronic component, and a noise reduction member configured to surround at least a portion of a second surface of the shielding member and reduce audible noise caused from the first electronic component and/or the second electronic component.

Advantageous Effects

According to various embodiments of the disclosure, a heat-radiating structure including a shielding member, an insulating member, and/or a noise reducing member may be used to block electromagnetic interference generated by an electronic component disposed on a PCB, to improve heat radiation, or to reduce audible noise.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
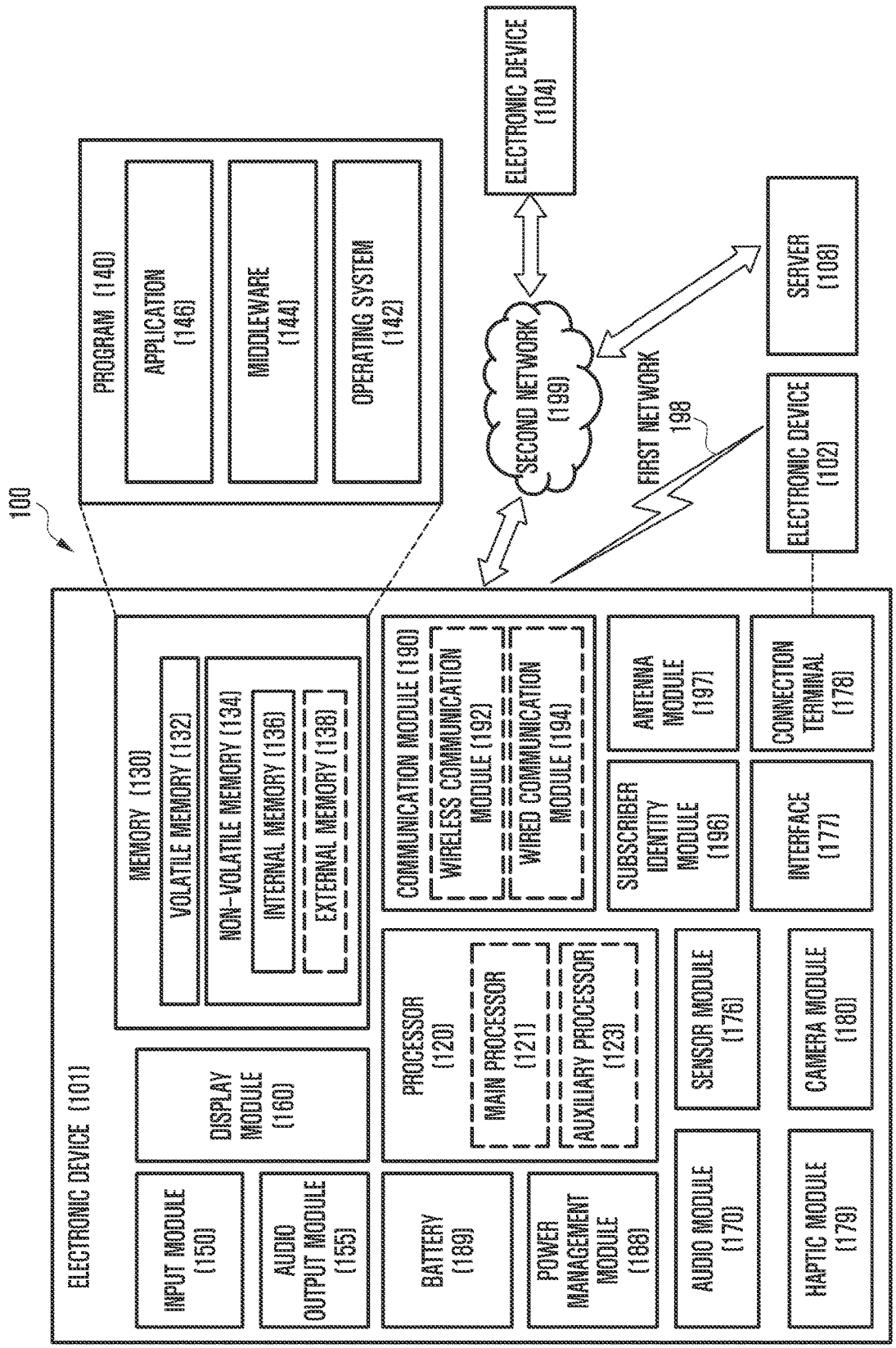
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, an audio output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semisupervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. Non-volatile memory may include internal memory 136 and/or external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the audio output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Figure 2A:
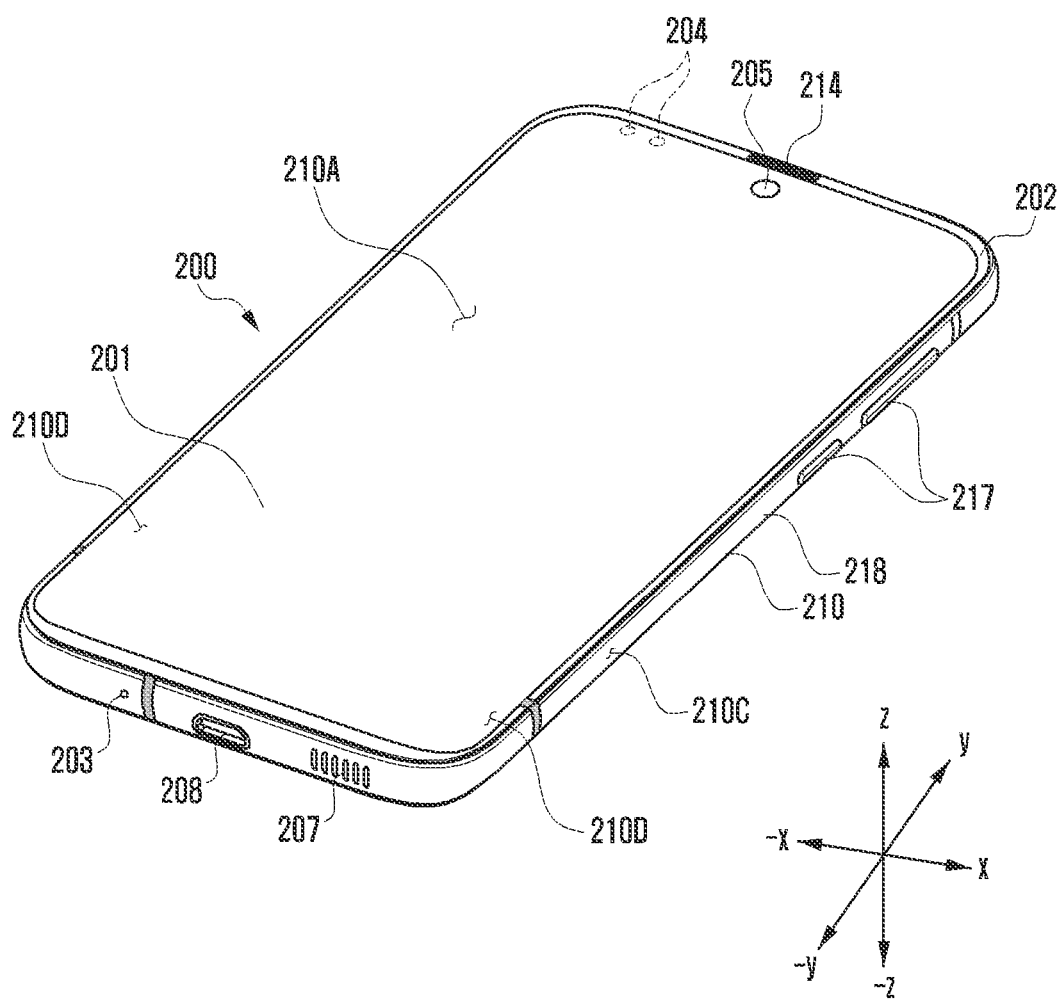
FIG. 2A is a front perspective view of an electronic device according to an embodiment of the disclosure.
Figure 2B:
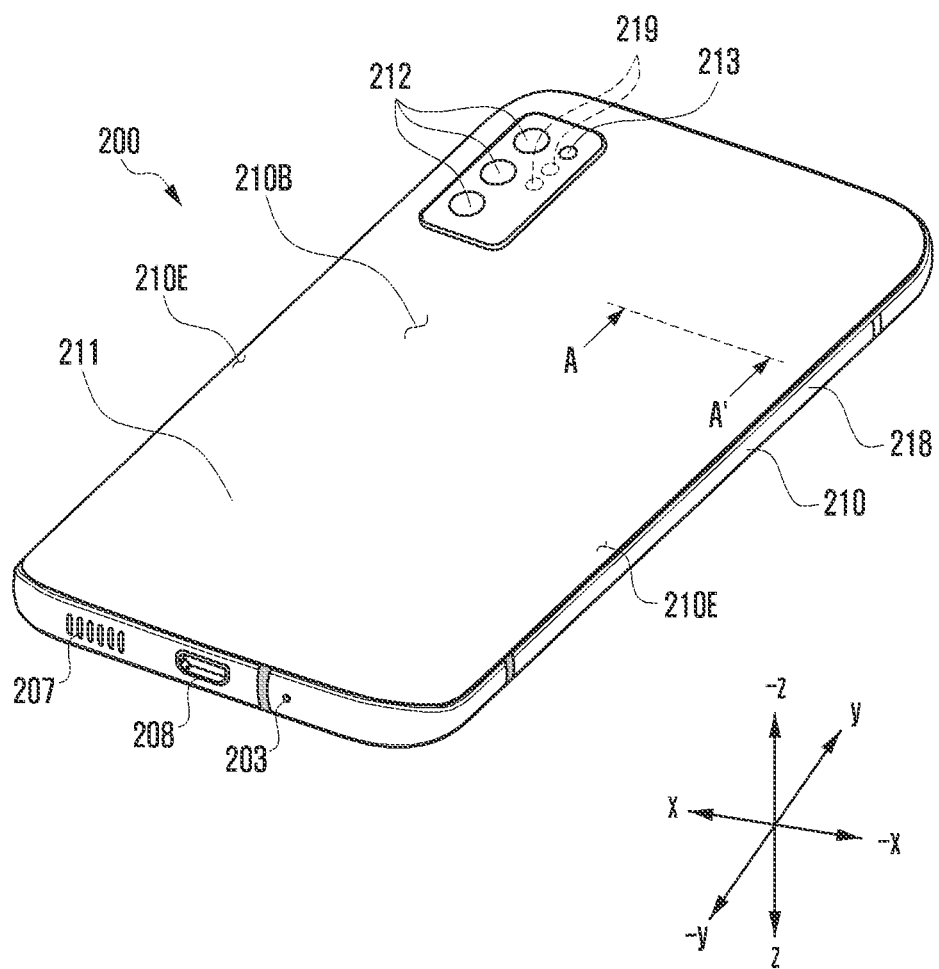
FIG. 2B is a rear perspective view of an electronic device according to an embodiment of the disclosure.

FIG. 2A is a front perspective view of an electronic device according to an embodiment of the disclosure. FIG. 2B is a rear perspective view of the electronic device according to an embodiment of the disclosure.

Referring to FIGS. 2A and 2B, an electronic device 200 according to an embodiment may include a housing 210 including a first surface (or front surface) 210A, a second surface (or rear surface) 210B, and a side surface 210C surrounding the space between the first surface 210A and the second surface 210B. In another embodiment (not illustrated), the housing may denote a structure that forms a part of the first surface 210A, the second surface 210B, and the side surface 210C illustrated in FIGS. 2A and 2B. According to an embodiment, the first surface 210A may be formed by a front plate 202, at least a part of which is substantially transparent (for example, a glass plate including various coating layers, or a polymer plate). The second surface 210B may be formed by a rear plate 211 that is substantially opaque. The rear plate 211 may be made of coated or colored glass, ceramic, polymer, metal (for example, aluminum, stainless steel (STS), or magnesium), or a combination of at least two of the above-mentioned materials. The side surface 210C may be formed by a side bezel structure (or "side member") 218 which is coupled to the front plate 202 and to the rear plate 211, and which includes metal and/or polymer. In some embodiments, the rear plate 211 and the side bezel structure 218 may be formed integrally and may include the same material (for example, a metal material such as aluminum).

In the illustrated embodiment, the front plate 202 may include two first areas 210D on both ends of the long edge of the front plate 202 such that the two first areas 210D bend from the first surface 210A toward the rear plate 211 and extend seamlessly. In the illustrated embodiment (see FIG. 2B), the rear plate 211 may include two second areas 210E on both ends of the long edge such that the two second areas 210E bend from the second surface 210B toward the front plate 202 and extend seamlessly. In some embodiments, the front plate 202 (or the rear plate 211) may include only one of the first areas 210D (or the second areas 210E). In another embodiment, a part of the first areas 210D or the second areas 210E may not be included. In the above embodiments, when seen from the side surface of the electronic device 200, the side bezel structure 218 may have a first thickness (or width) on a part of the side surface, which does not include the first areas 210D or the second areas 210E as described above, and may have a second thickness that is smaller than the first thickness on a part of the side surface, which includes the first areas 210D or the second areas 210E.

According to an embodiment, the electronic device 200 may include at least one of a display 201, audio modules 203, 207, and 214, sensor modules 204 and 219, camera modules 205, 212, and 213, a key input device 217, indicator, and connector holes 208 and 209. In some embodiments, at least one of the constituent elements (for example, the key input device 217 or indicator) of the electronic device 200 may be omitted, or the electronic device 200 may additionally include another constituent element.

The display 201 may be exposed through a corresponding part of the front plate 202, for example. In some embodiments, at least a part of the display 201 may be exposed through the front plate 202 that forms the first areas 210D of the side surface 210C and the first surface 210A. In some embodiments, the display 201 may have a corner formed in substantially the same shape as that of the adjacent outer periphery of the front plate 202. In another embodiment (not illustrated), in order to increase the area of exposure of the display 201, the interval between the outer periphery of the display 201 and the outer periphery of the front plate 202 may be formed to be substantially identical.

The audio modules may include a microphone hole 203 and speaker holes 207 and 214. A microphone for acquiring an external sound may be arranged in the microphone hole 203, and a plurality of microphones may be arranged therein such that the direction of a sound can be sensed in some embodiments. The speaker holes 207 and 214 may include an outer speaker hole 207 and a speech receiver hole 214. In some embodiments, the speaker holes 207 and 214 and the microphone hole 203 may be implemented as a single hole, or a speaker may be included (for example, a piezoelectric speaker) without the speaker holes 207 and 214.

The sensor modules 204 and 219 may generate an electric signal or a data value corresponding to the internal operating condition of the electronic device 200 or the external environment condition thereof. The sensor modules 204 and 219 may include, for example, a first sensor module 204 (for example, a proximity sensor) arranged on the first surface 210A of the housing 210, and/or a second sensor module (not illustrated) (for example, a fingerprint sensor), and/or a third sensor module 219 (for example, a heart rate monitor (HRM) sensor) arranged on the second surface 210B of the housing 210, and/or a fourth sensor module (for example, a fingerprint sensor). The fingerprint sensor may be arranged not only on the first surface 210A (for example, the display 201) of the housing 210, but also on the second surface 210B thereof. The electronic device 200 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor (e.g., sensor module 204).

The camera modules 205, 212, and 213 may include a first camera device (e.g., camera module 205) arranged on the first surface 210A of the electronic device 200, a second camera device (e.g., camera module 212) arranged on the second surface 210B thereof, and/or a flash 213. The camera devices 205 and 212 may include a single lens or a plurality of lenses, an image sensor, and/or an image signal processor. The flash 213 may include, for example, a light-emitting diode or a xenon lamp. In some embodiments, two or more lenses (an infrared camera, a wide-angle lens, and a telephoto lens) and image sensors may be arranged on a single surface of the electronic device 200.

The key input device 217 may be arranged on the side surface 210C of the housing 210. In another embodiment, the electronic device 200 may not include a part of the above-mentioned key input device 217 or the entire key input device 217, and the key input device 217 (not included) may be implemented in another type, such as a soft key, on the display 201. In some embodiments, the key input device may include a sensor module 216 arranged on the second surface 210B of the housing 210.

The indicator may be arranged on the first surface 210A of the housing 210, for example. The indicator may provide information regarding the condition of the electronic device 200 in a light type, for example. In another embodiment, the indicator may provide a light source that interworks with operation of the camera module 205, for example. The indicator may include, for example, a light emitting diode (LED), an infrared (IR) LED, and a xenon lamp.

The connector holes 208 and 209 may include a first connector hole 208 capable of containing a connector (for example, a USB connector) for transmitting/receiving power and/or data to/from an external electronic device, and/or a second connector hole (for example, an earphone jack) 209 capable of containing a connector for transmitting/receiving an audio signal to/from the external electronic device.

In another embodiment (not illustrated), a recess or an opening may be formed in a part of the screen display area of the display 201, and at least one of an audio module (e.g., speaker hole 214), a sensor module 204, a camera module 205, and a light-emitting element 206 may be included and aligned with the recess or the opening. In another embodiment (not illustrated), on the back surface of the screen display area of the display 201, at least one of an audio module (e.g., speaker hole 214), a sensor module 204, a camera module 205, a fingerprint sensor (e.g., sensor module 216), and a light-emitting element 206 may be included. In another embodiment (not illustrated), the display 201 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 204 and 219 and/or at least a part of the key input device 217 may be arranged in the first areas 210D and/or the second areas 210E.

According to an embodiment, an area facing the display 201 and the camera module 205 may be a portion of an area configured to display contents, and may be formed to be a transmission area having predetermined transmittance. According to an embodiment, the transmission area may be configured to have transmittance in a range of about 5% to about 20%. Such a transmission area may include an area overlapping an effective aperture (for example, a field of view) of the camera module 205 through which light for generating an image by forming an image by an image sensor passes. For example, the transmission area of the display 201 may include an area having a lower pixel density than a peripheral area. For example, the camera module 205 may include an under-display camera (UDC).

Figure 3:
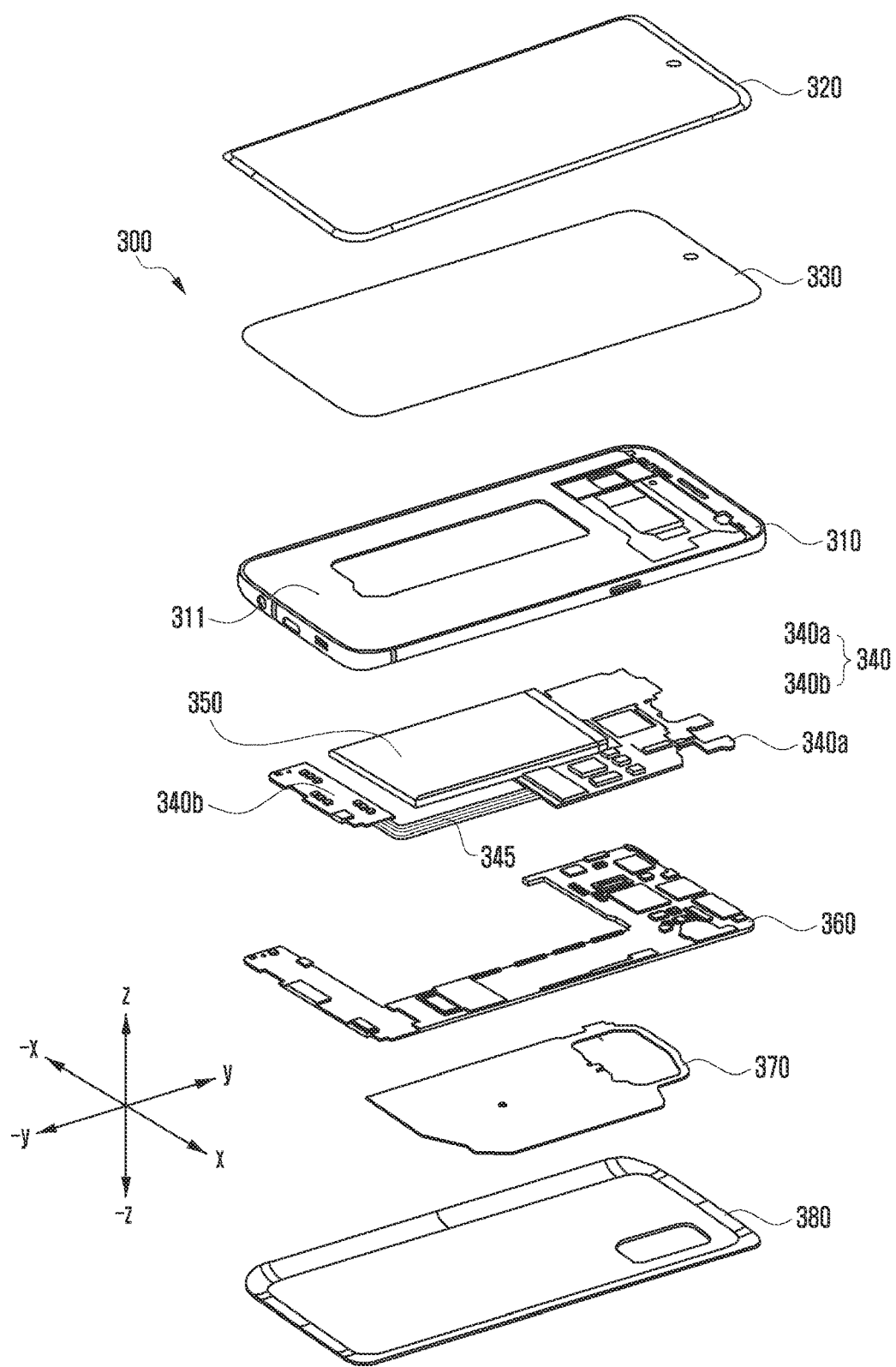
FIG. 3 is an exploded perspective view of an electronic device according to an embodiment of the disclosure.

FIG. 3 is an exploded perspective view of the electronic device according to an embodiment of the disclosure.

Referring to FIG. 3, an electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 101 or 200 of FIG. 1 to FIG. 2B, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor, a graphic processing device, an image signal processor, a sensor hub processor, or a communication processor.

According to various embodiments, the printed circuit board 340 may include a first PCB 340a and/or a second PCB 340b. For example, the first PCB 340a and the second PCB 340b may be arranged to be spaced apart from each other and may be electrically connected to each other by using a connection member 345 (for example, a coaxial cable and/or a flexible PCB (FPCB)). For another example, the printed circuit board 340 may include a structure in which multiple printed circuit boards (PCBs) are stacked on each other. The printed circuit board 340 may include an interposer structure. The printed circuit board 340 may be implemented as a flexible printed circuit board (FPCB) form and/or a rigid printed circuit board (PCB) form.

The memory may include a volatile memory or a nonvolatile memory, for example.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is a device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

Figure 4:
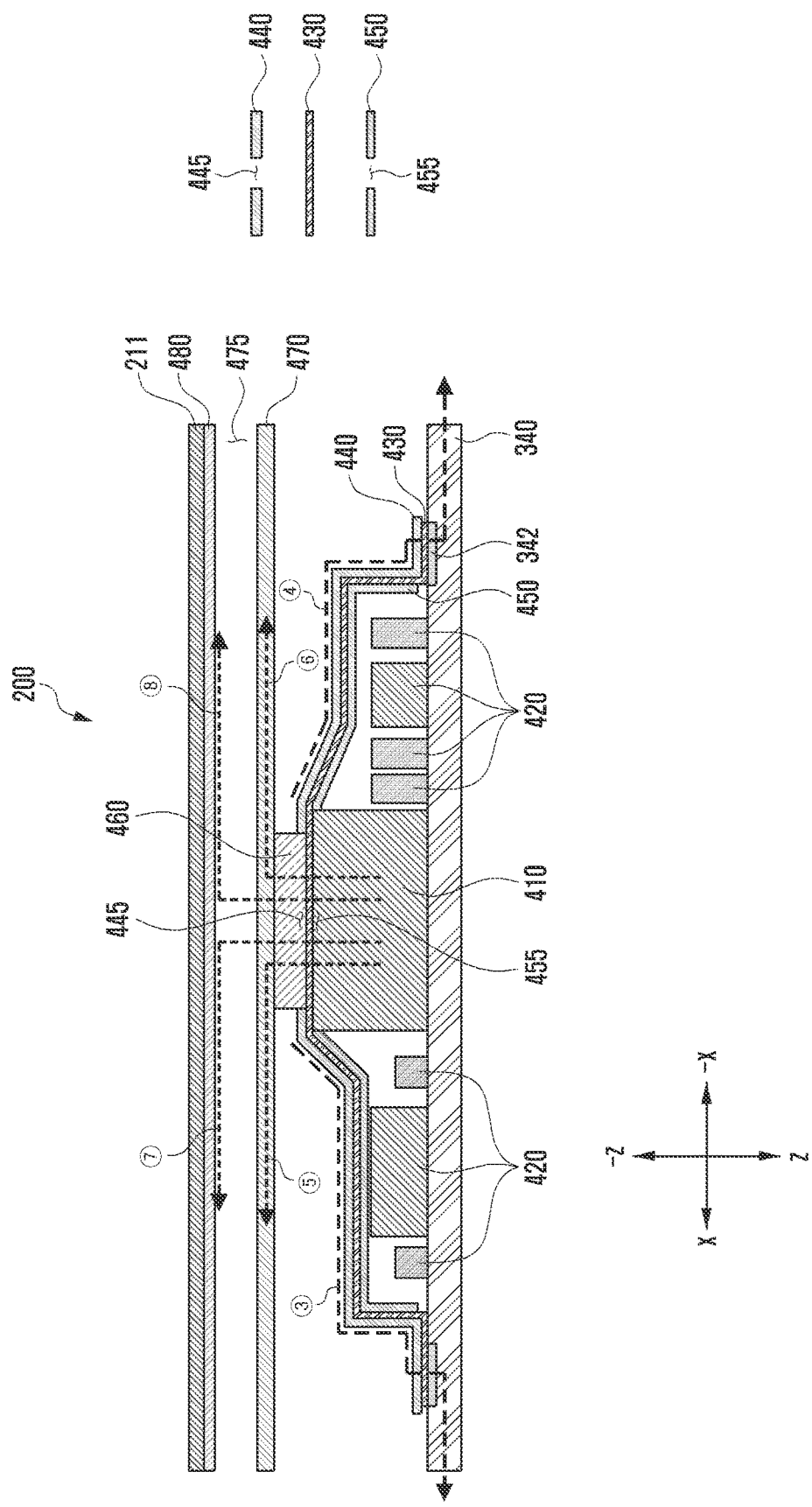
FIG. 4 is a schematic sectional diagram illustrating part A-A' of the electronic device disclosed in FIG. 2B according to an embodiment of the disclosure.

FIG. 4 is a schematic sectional diagram illustrating part A-A' of the electronic device disclosed in FIG. 2B according to an embodiment of the disclosure.

In an embodiment, part A-A' of the electronic device 200 disclosed in FIG. 2B may be a section of a portion in which the second support member 360 and the antenna 370 of the electronic device 300 disclosed in FIG. 3 are not overlap or omitted.

The electronic device 200 In FIG. 4 may include embodiments described with reference to the electronic device 101 in FIG. 1, the electronic device 200 in FIGS. 2A and 2B, and/or the electronic device 300 in FIG. 3.

Referring to FIG. 4, identical numerals may be used for substantially identical elements of the embodiments disclosed the electronic device 200 in FIGS. 2A and 2B and the electronic device 300 in FIG. 3, and an overlapping description thereof may be omitted.

In an embodiment, the embodiment related to the electronic device 200 in FIG. 4 shows and explains a bar-type electronic device but is not limited thereto, and may be applied to electronic devices such as a foldable-type, rollable-type, sliding-type, and wearable-type electronic device, a tablet personal computer (PC), or a laptop PC.

Referring to FIG. 4, an electronic device 200 according to various embodiments of the disclosure may include a printed circuit board 340, a first electronic component 410, a second electronic component 420, a shielding member 430, a first thermal diffusion member 440, a noise reduction member 450, a heat transfer member 460, a second thermal diffusion member 470, a third thermal diffusion member 480, and/or a rear plate 211.

According to an embodiment, the printed circuit board 340 may be disposed in a housing (for example, the housing 210 in FIG. 2B). The first electronic component 410 and/or the second electronic component 420 may be arranged in one direction (for example, −z-axis direction) of the printed circuit board 340. The first electronic component 410 and/or the second electronic component 420 may be mounted on the printed circuit board 340 by using a conductive pad (not shown) formed on the printed circuit board 340.

According to embodiment, for example, the processor 120, the memory 130, the input module 150, the audio output module 155, the audio module 170, the sensor module 176, the power management module 188, and/or the interface 177 disclosed in FIG. 1 may be mounted on the printed circuit board 340. The processor may include at least one of, for example, a central processing device, an application processor, a graphic process device, an image signal processor, a sensor hub processor, or a communication processor. The printed circuit board 340 may be implemented as a flexible printed circuit board (FPCB) form and/or a rigid printed circuit board (PCB) form.

According to various embodiments, the printed circuit board 340 may include a ground part 342 formed along at least a portion of a peripheral area of the first electronic component 410 and/or the second electronic component 420. The ground part 342 may include a conductive line patterned along an outer side (for example, an edge) of the first electronic component 410 and/or the second electronic component 420 arranged on the printed circuit board 340. The ground part 342 may include a ground contact pad. The ground part 342 may be formed by using, for example, a conductive metal (for example, a copper foil). The ground part 342 may be in contact with and coupled to an end surface of the shielding member 430 and may diffuse heat transferred through the first thermal diffusion member 440 disposed on the upper part (for example, −z-axis direction) of the shielding member 430, to the entirety of the printed circuit board 340 or the outside.

According to an embodiment, the first electronic component 410 may include a processor (for example, an application processor (AP)), a communication processor (CP) (for example, the processor 120 in FIG. 1), or a power management integrated circuit (PMIC) (for example, the power management module 188 in FIG. 1). The first electronic component 410 may radiate heat according to an operation of the electronic device 200 and cause electromagnetic interference. The first electronic component 410 may cause audible noise in a high frequency band according to an operation of the electronic device 200. The first electronic component 410 may be implemented as at least one chip.

According to an embodiment, the second electronic component 420 may be disposed around the first electronic component 410 for a stable operation of the first electronic component 410 (for example, a processor or a PMIC). The second electronic component 420 may include, for example, at least one of an inductor, a resister, or a capacitor. When there is a large difference in power ripple according to a power amount of the first electronic component 410 (for example, a PMIC), the second electronic component 420 (for example, at least one capacitor) may vibrate and audible noise in a specific frequency band may be caused.

According to an embodiment, the shielding member 430 may be disposed in a first direction (for example, −z-axis direction) of the first electronic component 410 and the second electronic component 420, and may be disposed to surround the first electronic component 410 and the second electronic component 420. An end surface of the shielding member 430 may be coupled to the ground part 342 formed on the printed circuit board 340 through thermocompression bonding. The shielding member 430 may shield electromagnetic interference caused from the first electronic component 410 and/or the second electronic component 420. The shielding member 430 may form a conformal shielding structure.

According to various embodiments, the shielding member 430 may include a conductive fiber sheet (for example, a nano fiber), a copper (Cu) sheet, or an aluminum (Al) sheet having excellent thermal diffusion and heat transfer performance in a first direction (for example, −z-axis direction). The shielding member 430 may be formed to have a first thickness of, for example, about 20 μm-30 μm.

According to an embodiment, the first thermal diffusion member 440 may be disposed in a first direction (for example, −z-axis direction and an upper surface) of the shielding member 430. The first thermal diffusion member 440 may surround at least a portion of a first surface (for example, −z-axis direction and an upper surface) of the shielding member 430. The first thermal diffusion member 440 may include a first opening 445 formed through a position in which at least a portion of the first electronic component 410 is disposed. The first opening 445 may be positioned to overlap at least a portion of the first electronic component 410. The first thermal diffusion member 440 may be disposed on a remaining portion of the shielding member 430 other than the first opening 445. The first thermal diffusion member 440 may absorb, diffuse, and radiate heat transferred from the first electronic component 410 and/or the shielding member 430. For example, the first thermal diffusion member 440 may transfer and radiate heat transferred from the first electronic component 410 and/or the shielding member 430 in a third direction (for example, direction ③ in FIG. 4) and a fourth direction (for example, direction ④ in FIG. 4) of the electronic device 200. In an embodiment, the third direction (for example, direction ③ in FIG. 4) may be a direction of x-axis and between x-axis and z-axis of the electronic device 200. In an embodiment, the fourth direction (for example, direction ④ in FIG. 4) may be the −x-axis direction and a direction between −x-axis and z-axis of the electronic device 200.

According to various embodiments, the first thermal diffusion member 440 may include a graphite sheet (for example, a nano fiber), a copper (Cu) sheet, or an aluminum (Al) sheet having excellent thermal diffusion and heat transfer performance in the third direction (for example, direction ③ in FIG. 4) and the fourth direction (for example, direction ④ in FIG. 4). The first thermal diffusion member 440 may be formed to have a second thickness of, for example, about 35 μm-50 μm.

According to various embodiments, the first thermal diffusion member 440 may be formed to have a thickness thicker than that of the shielding member 430 in order to perform a function of absorbing and diffusing heat transferred from the first electronic component 410 and/or the shielding member 430. For example, the second thickness of the first thermal diffusion member 440 may be formed to be thicker than the first thickness of the shielding member 430.

According to various embodiments, an insulation member (not shown) (for example, the insulation member 640 in FIG. 6) may be disposed on at least a portion of the first direction (for example, −z-axis direction and an upper surface) of the first thermal diffusion member 440. The insulation member (not shown) may prevent the first thermal diffusion member 440 from being electrically short-circuited with other electronic components in the electronic device 200. The insulation member (not shown) may prevent the first thermal diffusion member 440 from being damaged during a thermocompression process. The insulation member (not shown) may be formed of a dielectric (for example, a polymer) having excellent insulation properties and durability.

According to an embodiment, the noise reduction member 450 may be disposed in a second direction (for example, z-axis direction and a lower surface) of the shielding member 430. The noise reduction member 450 may surround at least a portion of a second surface (for example, z-axis direction and a lower surface) of the shielding member 430. The noise reduction member 450 may include a second opening 455 formed through a position in which at least a portion of the first electronic component 410 is disposed. The second opening 455 may be positioned to overlap at least a portion of the first electronic component 410. The noise reduction member 450 may be disposed on a remaining portion of the shielding member 430 other than the second opening 455. The noise reduction member 450 may be disposed to surround at least a portion of the first electronic component 410 and/or the second electronic component 420.

According to various embodiments, the noise reduction member 450 may reduce audible noise caused from the first electronic component 410 (for example, a PMIC) and/or the second electronic component 420 (for example, at least one capacitor). The noise reduction member 450 may absorb and reflect audible noise with respect to a specific frequency band caused from the first electronic component 410 and/or the second electronic component 420.

In an embodiment, in case that the noise reduction member 450 performs a function of absorbing audible noise, the noise reduction member 450 may be formed of a nonconductive material (for example, a sound absorption material) such as pulp and may absorb audible noise caused from the first electronic component 410 and/or the second electronic component 420. In another embodiment, in case that the noise reduction member 450 performs a function of reflecting and blocking audible noise, the noise reduction member 450 may be formed of a conductive material such as a metal and may reflect and block audible noise caused from the first electronic component 410 and/or the second electronic component 420. When the noise reduction member 450 is formed of a conductive material (for example, a metal), an insulation material (not shown) (for example, the insulation member 550 in FIG. 5) may be disposed in a second direction (for example, z-axis direction and a lower surface) of the noise reduction member 450. The insulation member (not shown) may prevent the noise reduction member 450 from being electrically short-circuited with the first electronic component 410 and/or the second electronic component 420. The insulation member (not shown) may be formed of a dielectric (for example, a polymer) having excellent insulation properties and durability.

According to an embodiment, the first heat transfer member 460 may be disposed in the first direction (for example, −z-axis direction and an upper surface) of the shielding member 430 overlapping at least a portion of the first electronic component 410. At least a portion of the heat transfer member 460 may be disposed in the first opening 445 formed through the first thermal diffusion member 440. The second surface (for example, z-axis direction and a lower surface) of the heat transfer member 460 may be in contact with and coupled to at least a portion of the first surface (for example, −z-axis direction and an upper surface) of the shielding member 430. The heat transfer member 460 may transfer and radiate heat generated from the first electronic component 410 in the first direction (for example, −z-axis direction).

According to an embodiment, the first heat transfer member 460 may absorb heat generated from the first electronic component 410 and cool the heat by transferring the heat in a direction (for example, −z-axis direction) in which the second thermal diffusion member 470 is disposed. At least a portion of the second surface (for example, z-axis direction and a lower surface) of the heat transfer member 460 may be disposed in the first opening 445 formed through the first thermal diffusion member 440, come in direct contact with at least a portion of the first surface (for example, −z-axis direction and an upper surface) of the shielding member 430, and may reduce heat resistance with respect to a radiation path of the heat transferred to the first direction (for example, −z-axis direction) through the heat transfer member 460. The heat transfer member 460 may include, for example, a thermal interface material (TIM) having a high viscosity in a fluid state or a carbon fiber TIM.

According to various embodiments, the heat transfer member 460 may be omitted. In case that the heat transfer member 460 is omitted, the first opening 445 may not be formed through the first thermal diffusion member 440. In this case, the first thermal diffusion member 440 may be in direct contact with and coupled to the second thermal diffusion member 470.

According to an embodiment, the second thermal diffusion member 470 may be disposed in the first direction (for example, −z-axis direction and an upper surface) of the heat transfer member 460. The second surface (for example, z-axis direction and a lower surface) of the second thermal diffusion member 470 may be in contact with and coupled to the first surface (for example, −z-axis direction and an upper surface) of the heat transfer member 460. The second surface (for example, z-axis direction and a lower surface) of the second heat transfer member (e.g., second thermal diffusion member 470) may be disposed spaced apart from the first surface (for example, −z-axis direction and an upper surface) of the heat transfer member 460. The second thermal diffusion member 470 may absorb, diffuse, and radiate heat transferred from the heat transfer member 460.

According to various embodiments, the second thermal diffusion member 470 may transfer and radiate heat transferred from the heat transfer member 460 in a fifth direction (for example, x-axis direction and direction ⑤ in FIG. 4) and a sixth direction (for example, −x-axis direction and direction ⑥ in FIG. 4) of the electronic device 200. The second thermal diffusion member 470 may include a graphite sheet, a copper (Cu) sheet, or an aluminum (Al) sheet having excellent thermal diffusion and heat transfer performance in the fifth direction (for example, x-axis direction) and the sixth direction (for example, −x-axis direction). The second thermal diffusion member 470 may include a heat dissipation plate, a heat sink, a vapor chamber, or a heat pipe.

According to an embodiment, the third thermal diffusion member 480 may be disposed in the first direction (for example, −z-axis direction and an upper surface) of the second thermal diffusion member 470 while having an air gap 475 therebetween. The third thermal diffusion member 480 may be disposed in a second direction (for example, z-axis direction and a lower surface) of the rear plate 211. The third thermal diffusion member 480 may transfer and radiate heat transferred through the second thermal diffusion member 470 and the air gap 475 in a seventh direction (for example, x-axis direction and direction ⑦ in FIG. 4) and a eighth direction (for example, −x-axis direction and direction ⑧ in FIG. 4) of the electronic device 200.

According to various embodiments, the air gap 475 may be formed between the second thermal diffusion member 470 and the third thermal diffusion member 480, and may facilitate the diffusion of heat transferred through the second thermal diffusion member 470. The third thermal diffusion member 480 may include a graphite sheet, a copper (Cu) sheet, or an aluminum (Al) sheet having excellent thermal diffusion and heat transfer performance in the seventh direction (for example, x-axis direction) and the eighth direction (for example, −x-axis direction).

According to an embodiment, the rear plate 211 may protect the rear surface of the electronic device 200. The third thermal diffusion member 480 may be disposed in the second direction (for example, z-axis direction and a lower surface) of the rear plate 211. The rear plate 211 may be formed by, for example, coated or colored glass, ceramic, polymers, metals (for example, aluminum, stainless steel (STS), or magnesium), or a combination of at least two thereof.

Figure 5:
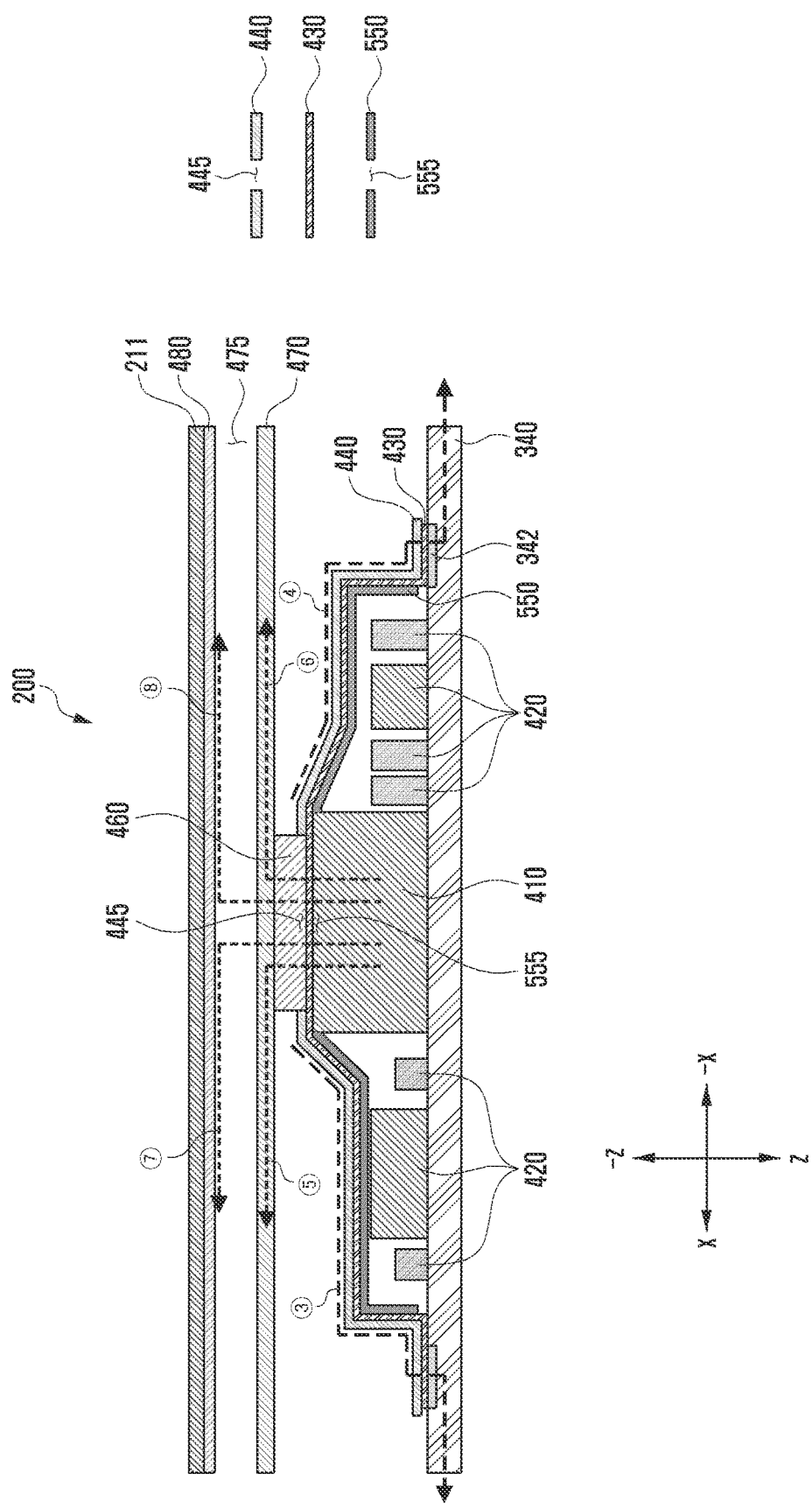
FIG. 5 is a schematic sectional diagram of an embodiment illustrating part A-A' of the electronic device disclosed in FIG. 2B according to an embodiment of the disclosure.

FIG. 5 is a schematic sectional diagram of an embodiment illustrating part A-A' of the electronic device disclosed in FIG. 2B according to an embodiment of the disclosure.

The electronic device 200 in FIG. 5 may be integrated with the embodiment disclosed in FIG. 4. The electronic device 200 in FIG. 5 may include the embodiments shown in FIG. 4. With regard to the description of FIG. 5, identical numerals may be used for substantially identical elements of the embodiments disclosed in the electronic device 200 in FIG. 4, and an overlapping description thereof may be omitted.

Referring to FIG. 5, the electronic device 200 according to various embodiments of the disclosure may include a printed circuit board 340, a first electronic component 410, a second electronic component 420, a shielding member 430, a first thermal diffusion member 440, an insulation member 550, a heat transfer member 460, a second thermal diffusion member 470, a third thermal diffusion member 480, and/or a rear plate 211.

The electronic device 200 disclosed in FIG. 5 may be an embodiment in which the noise reduction member 450 included in the electronic device 200 in FIG. 4 is replaced with the insulation member 500.

According to an embodiment, the first electronic component 410 and/or the second electronic component 420 may be arranged in one direction (for example, −z-axis direction) of the printed circuit board 340.

According to various embodiments, the printed circuit board 340 may include a ground part 342 formed along at least a portion of a peripheral area of the first electronic component 410 and/or the second electronic component 420. The ground part 342 may be in contact with an end surface of the shielding member 430 and may diffuse heat transferred through the first thermal diffusion member 440 disposed on the upper part (for example, −z-axis direction) of the shielding member 430, to the entirety of the printed circuit board 340 or the outside.

According to an embodiment, the first electronic component 410 may include a processor (for example, an application processor (AP)), a communication processor (CP) (for example, the processor 120 in FIG. 1), or a power management integrated circuit (PMIC) (for example, the power management module 188 in FIG. 1).

According to an embodiment, the second electronic component 420 may be disposed around the first electronic component 410 for a stable operation of the first electronic component 410 (for example, a processor or a PMIC).

According to an embodiment, the shielding member 430 may be disposed in a first direction (for example, −z-axis direction) of the first electronic component 410 and the second electronic component 420, and may be disposed to surround the first electronic component 410 and the second electronic component 420. The shielding member 430 may shield electromagnetic interference caused from the first electronic component 410 and/or the second electronic component 420.

According to an embodiment, the first thermal diffusion member 440 may be disposed in a first direction (for example, −z-axis direction and an upper surface) of the shielding member 430. The first thermal diffusion member 440 may surround at least a portion of a first surface (for example, −z-axis direction and an upper surface) of the shielding member 430. The first thermal diffusion member 440 may include a first opening 445 formed in a position in which at least a portion of the first electronic component 410 is disposed. The first opening 445 may be positioned to overlap at least a portion of the first electronic component 410. The first thermal diffusion member 440 may absorb, diffuse, and radiate heat transferred from the first electronic component 410 and/or the shielding member 430. For example, the first thermal diffusion member 440 may transfer and radiate heat transferred from the first electronic component 410 and/or the shielding member 430 in a third direction (for example, direction ③ in FIG. 4) and a fourth direction (for example, direction ④ in FIG. 4) of the electronic device 200.

According to various embodiments, an insulation member (not shown) (for example, the insulation member 640 in FIG. 6) may be disposed on at least a portion of the first direction (for example, −z-axis direction and an upper surface) of the first thermal diffusion member 440. The insulation member (not shown) may prevent the first thermal diffusion member 440 from being electrically short-circuited with other electronic components in the electronic device 200. The insulation member (not shown) may prevent the first thermal diffusion member 440 from being damaged during a thermocompression process.

According to an embodiment, the insulation member 550 may be disposed in a second direction (for example, z-axis direction and a lower surface) of the shielding member 430. The insulation member 550 may surround at least a portion of a second surface (for example, z-axis direction and a lower surface) of the shielding member 430. The insulation member 550 may include a second opening 555 formed in a position in which at least a portion of the first electronic component 410 is disposed. The second opening 555 may be positioned to overlap at least a portion of the first electronic component 410. The insulation member 550 may be disposed on a remaining portion of the shielding member 430 other than the second opening 555. The insulation member 550 may be disposed to surround at least a portion of the first electronic component 410 and/or the second electronic component 420.

According to various embodiments, the insulation member 550 may prevent the shielding member 430 from being electrically short-circuited with the first electronic component 410 and/or the second electronic component 420 in the electronic device 200. The insulation member 550 may prevent the shielding member 430 from being damaged during a thermocompression process. The insulation member 550 may be formed of a dielectric (for example, a polymer) having excellent insulation properties and durability.

According to an embodiment, the first heat transfer member 460 may be disposed in the first direction (for example, −z-axis direction and an upper surface) of the shielding member 430 overlapping at least a portion of the first electronic component 410. At least a portion of the heat transfer member 460 may be disposed in the first opening 445 formed through the first thermal diffusion member 440. The second surface (for example, z-axis direction and a lower surface) of the heat transfer member 460 may be in contact with and coupled to at least a portion of the first surface (for example, −z-axis direction and an upper surface) of the shielding member 430. The heat transfer member 460 may transfer and radiate heat generated from the first electronic component 410 in the first direction (for example, −z-axis direction).

According to various embodiments, the heat transfer member 460 may be omitted. In case that the heat transfer member 460 is omitted, the first opening 445 may not be formed through the first thermal diffusion member 440. In this case, the first thermal diffusion member 440 may be in direct contact with and coupled to the second thermal diffusion member 470.

According to an embodiment, the second thermal diffusion member 470 may be disposed in the first direction (for example, −z-axis direction and an upper surface) of the heat transfer member 460. The second surface (for example, z-axis direction and a lower surface) of the second thermal diffusion member 470 may be in contact with and coupled to the first surface (for example, −z-axis direction and an upper surface) of the heat transfer member 460. The second thermal diffusion member 470 may absorb, diffuse, and radiate heat transferred from the heat transfer member 460. The second thermal diffusion member 470 may transfer and radiate heat transferred from the heat transfer member 460 in a fifth direction (for example, x-axis direction and direction ⑤ in FIG. 5) and a sixth direction (for example, −x-axis direction and direction ⑥ in FIG. 5) of the electronic device 200.

According to an embodiment, the third thermal diffusion member 480 may be disposed in the first direction (for example, −z-axis direction and an upper surface) of the second thermal diffusion member 470 while having an air gap 475 therebetween. The third thermal diffusion member 480 may be disposed in a second direction (for example, z-axis direction and a lower surface) of the rear plate 211. The third thermal diffusion member 480 may transfer and radiate heat transferred through the second thermal diffusion member 470 and the air gap 475 in a seventh direction (for example, x-axis direction and direction ⑦ in FIG. 5) and a eighth direction (for example, −x-axis direction and direction ⑧ in FIG. 5) of the electronic device 200.

Figure 6:
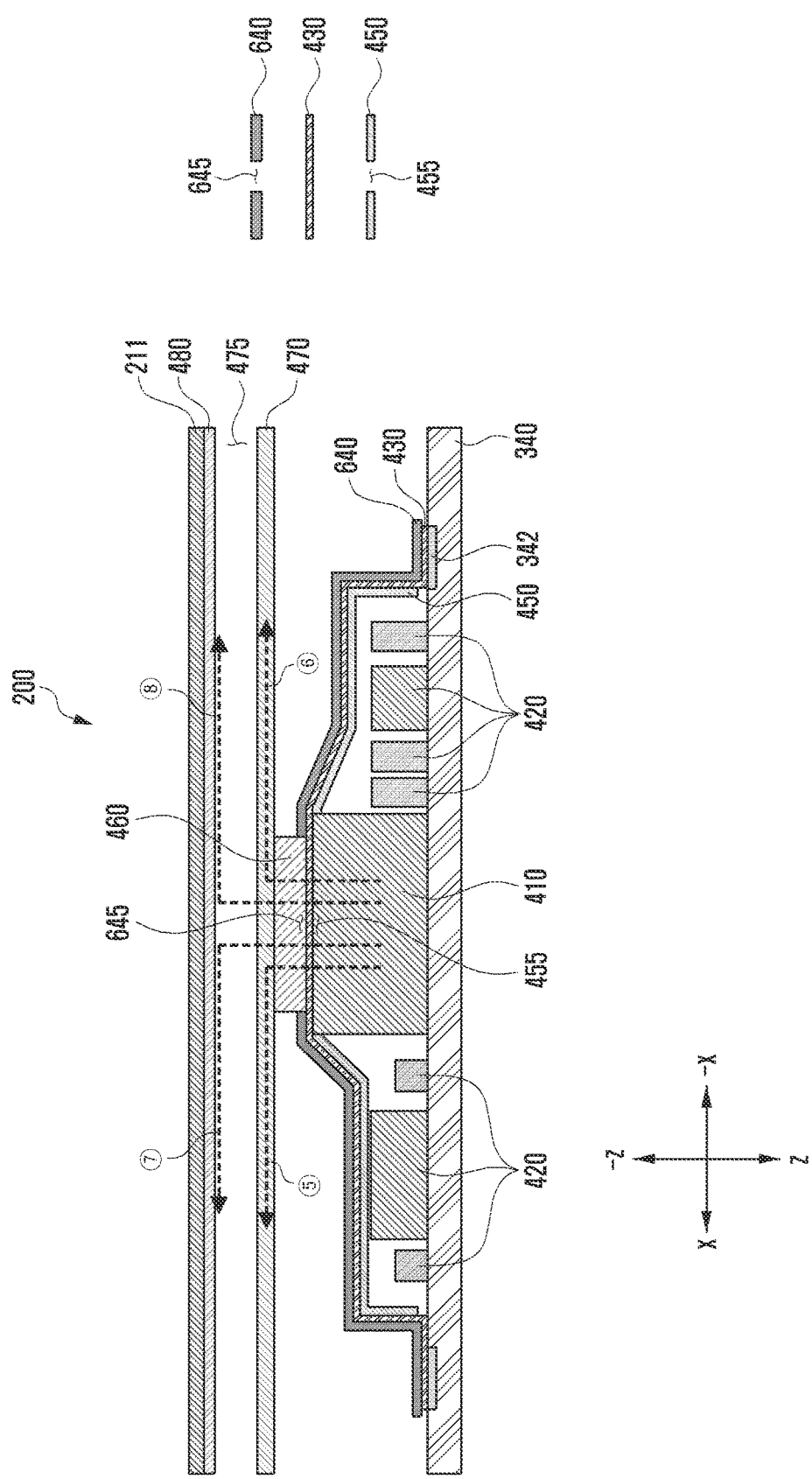
FIG. 6 is a schematic sectional diagram of various embodiments illustrating part A-A' of the electronic device disclosed in FIG. 2B according to an embodiment of the disclosure.

FIG. 6 is a schematic sectional diagram of various embodiments illustrating part A-A' of the electronic device disclosed in FIG. 2B according to an embodiment of the disclosure.

The electronic device 200 in FIG. 6 may be integrated with the embodiment disclosed in FIG. 4 or FIG. 5. The electronic device 200 in FIG. 6 may include the embodiments shown in FIG. 4 or FIG. 5. With regard to the description of FIG. 6, identical numerals may be used for substantially identical elements of the embodiments disclosed in the electronic device 200 in FIG. 4 of in FIG. 5, and an overlapping description thereof may be omitted.

Referring to FIG. 6, the electronic device 200 according to various embodiments of the disclosure may include a printed circuit board 340, a first electronic component 410, a second electronic component 420, a shielding member 430, an insulation member 640, a noise reduction member 450, a heat transfer member 460, a second thermal diffusion member 470, a third thermal diffusion member 480, and/or a rear plate 211.

The electronic device 200 disclosed in FIG. 6 may be an embodiment in which the first thermal diffusion member 440 included in the electronic device 200 in FIG. 4 is replaced with the insulation member 640.

According to an embodiment, the first electronic component 410 and/or the second electronic component 420 may be arranged in one direction (for example, −z-axis direction) of the printed circuit board 340.

According to various embodiments, the printed circuit board 340 may include a ground part 342 formed along at least a portion of a peripheral area of the first electronic component 410 and/or the second electronic component 420. The ground part 342 may be in contact with an end surface of the shielding member 430 and may diffuse heat transferred through the first thermal diffusion member 440 disposed on the upper part (for example, −z-axis direction) of the shielding member 430, to the entirety of the printed circuit board 340 or the outside.

According to an embodiment, the second electronic component 420 may be disposed around the first electronic component 410 for a stable operation of the first electronic component 410 (for example, a processor or a PMIC).

According to an embodiment, the shielding member 430 may be disposed in a first direction (for example, −z-axis direction) of the first electronic component 410 and the second electronic component 420, and may be disposed to surround the first electronic component 410 and the second electronic component 420. The shielding member 430 may shield electromagnetic interference caused from the first electronic component 410 and/or the second electronic component 420.

According to an embodiment, the insulation member 640 may be disposed in a first direction (for example, −z-axis direction and an upper surface) of the shielding member 430. The insulation member 640 may surround at least a portion of a first surface (for example, −z-axis direction and an upper surface) of the shielding member 430. The insulation member 640 may prevent the shielding member 430 from being electrically short-circuited with other electronic components in the electronic device 200. The insulation member 640 may prevent the shielding member 430 from being damaged during a thermocompression process.

According to various embodiments, the insulation member 640 may include a first opening 645 formed through a position in which at least a portion of the first electronic component 410 is disposed. The first opening 645 may be positioned to overlap at least a portion of the first electronic component 410.

According to an embodiment, the noise reduction member 450 may be disposed in a second direction (for example, z-axis direction and a lower surface) of the shielding member 430. The noise reduction member 450 may surround at least a portion of a second surface (for example, z-axis direction and a lower surface) of the shielding member 430. The noise reduction member 450 may include a second opening 455 formed in a position in which at least a portion of the first electronic component 410 is disposed. The second opening 455 may be positioned to overlap at least a portion of the first electronic component 410. The noise reduction member 450 may be disposed on a remaining portion of the shielding member 430 other than the second opening 455. The noise reduction member 450 may be disposed to surround at least a portion of the first electronic component 410 and/or the second electronic component 420.

According to various embodiments, the noise reduction member 450 may reduce audible noise caused from the first electronic component 410 (for example, a PMIC) and/or the second electronic component 420 (for example, at least one capacitor). The noise reduction member 450 may absorb and reflect audible noise with respect to a specific frequency band caused from the first electronic component 410 and/or the second electronic component 420.

In an embodiment, in case that the noise reduction member 450 performs a function of absorbing audible noise, the noise reduction member 450 may be formed of a sound absorption material such as pulp and may absorb audible noise caused from the first electronic component 410 and/or the second electronic component 420. In another embodiment, in case that the noise reduction member 450 performs a function of reflecting and blocking audible noise, the noise reduction member 450 may be formed of a reflective material such as a metal and may reflect and block audible noise caused from the first electronic component 410 and/or the second electronic component 420. When the noise reduction member 450 is formed of a metal material, an insulation material (not shown) (for example, the insulation member 550 in FIG. 5) may be disposed in a second direction (for example, z-axis direction and a lower surface) of the noise reduction member 450.

According to an embodiment, the first heat transfer member 460 may be disposed in the first direction (for example, −z-axis direction and an upper surface) of the shielding member 430 overlapping at least a portion of the first electronic component 410. At least a portion of the heat transfer member 460 may be disposed in the first opening 645 formed through the insulation member 640. The second surface (for example, z-axis direction and a lower surface) of the heat transfer member 460 may be in contact with and coupled to at least a portion of the first surface (for example, −z-axis direction and an upper surface) of the shielding member 430. The heat transfer member 460 may transfer and radiate heat generated from the first electronic component 410 in the first direction (for example, −z-axis direction).

According to various embodiments, the heat transfer member 460 may be omitted. In case that the heat transfer member 460 is omitted, the first opening 645 may not be formed through the insulation member 640. In this case, the insulation member 640 may be in direct contact with and coupled to the second thermal diffusion member 470.

According to an embodiment, the second thermal diffusion member 470 may be disposed in the first direction (for example, −z-axis direction and an upper surface) of the heat transfer member 460. The second surface (for example, z-axis direction and a lower surface) of the second thermal diffusion member 470 may be in contact with and coupled to the first surface (for example, −z-axis direction and an upper surface) of the heat transfer member 460. The second thermal diffusion member 470 may absorb, diffuse, and radiate heat transferred from the heat transfer member 460. The second thermal diffusion member 470 may transfer and radiate heat transferred from the heat transfer member 460 in a fifth direction (for example, x-axis direction and direction ⑤ in FIG. 6) and a sixth direction (for example, −x-axis direction and direction ⑥ in FIG. 6) of the electronic device 200.

According to an embodiment, the third thermal diffusion member 480 may be disposed in the first direction (for example, −z-axis direction and an upper surface) of the second thermal diffusion member 470 while having an air gap 475 therebetween. The third thermal diffusion member 480 may be disposed in a second direction (for example, z-axis direction and a lower surface) of the rear plate 211. The third thermal diffusion member 480 may transfer and radiate heat transferred through the second thermal diffusion member 470 and the air gap 475 in a seventh direction (for example, x-axis direction and direction ⑦ in FIG. 6) and a eighth direction (for example, −x-axis direction and direction ⑧ in FIG. 6) of the electronic device 200.

An electronic device 101, 200, and 300 according to various embodiments of the disclosure may include a housing 210, a printed circuit board 340 disposed in the housing, a first electronic component 410 and/or a second electronic component 420 disposed on the printed circuit board, a shielding member 430 disposed to surround the first electronic component and/or the second electronic component, and a first thermal diffusion member 440 configured to surround at least a portion of a first surface of the shielding member.

According to various embodiments, the electronic device may include a noise reduction member 450 configured to surround at least a portion of a second surface of the shielding member 430 and reduce audible noise caused from the first electronic component 410 and/or the second electronic component 420.

According to various embodiments, the first thermal diffusion member 440 may include a first opening 445 positioned to overlap at least a portion of the first electronic component, and the electronic device may include a heat transfer member 460 disposed in the first opening and having a second surface coupled to at least a portion of the first surface of the shielding member.

According to various embodiments, the noise reduction member 450 may include a second opening 455 positioned to overlap at least a portion of the first electronic component 410.

According to various embodiments, the printed circuit board 340 may include a ground part 342 formed along at least a portion of a peripheral area of the first electronic component and/or the second electronic component and the ground part may be configured to be coupled to an end surface of the shielding member.

According to various embodiments, the shielding member 430 may be formed to have a first thickness (for example, about 20 μm-30 μm), the first thermal diffusion member may be formed to have a second thickness (for example, about 35 µm-50 µm), and the second thickness may be formed to be thicker than the first thickness.

According to various embodiments, the noise reduction member 450 may include a nonconductive material (for example, porous pulp) configured to absorb the audible noise.

According to various embodiments, the noise reduction member 450 may include a conductive material (for example, a metal) for configured to reflect and block the audible noise.

According to various embodiments, in case that the noise reduction member 450 includes a conductive material, an insulation member may be disposed on a second surface of the noise reduction member.

According to an embodiment, a second thermal diffusion member 470 may be disposed in a first direction of the heat transfer member 460.

According to various embodiments, a third thermal diffusion member 480 may be disposed in a first direction of the second thermal diffusion member 470 while having an air gap 475 therebetween and a rear plate 211 may be disposed in a first direction of the third thermal diffusion member.

According to various embodiments, the shielding member 430 may include a conductive fiber sheet, a copper (Cu) sheet, or an aluminum (Al) sheet.

According to various embodiments, the first electronic component 410 may include a processor or a power management integrated circuit (PMIC), and the second electronic component 420 may include at least one capacitor.

An electronic device 101, 200, and 300 according to various embodiments of the disclosure may include a housing 210, a printed circuit board 340 disposed in the housing, a first electronic component 410 and/or a second electronic component 420 disposed on the printed circuit board, a shielding member 430 disposed to surround the first electronic component and/or the second electronic component, a first thermal diffusion member 440 surrounding at least a portion of a first surface of the shielding member, and an insulation member 550 surrounding at least a portion of a second surface of the shielding member.

An electronic device 101, 200, and 300 according to various embodiments of the disclosure may include a housing 210, a printed circuit board 340 disposed in the housing, a first electronic component 410 and/or a second electronic component 420 disposed on the printed circuit board, a shielding member 430 disposed to surround the first electronic component and/or the second electronic component, and a noise reduction member 450 configured to surround at least a portion of a second surface of the shielding member and reduce audible noise caused from the first electronic component and/or a second electronic component.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a printed circuit board disposed in the housing;
   a first electronic component and a second electronic component disposed on the printed circuit board;
   a shielding member encapsulating the first electronic component and the second electronic component on the printed circuit board; and
   a first thermal diffusion member contacting at least a first portion of a first surface of the shielding member and comprising a first opening overlapping at least a portion of the first electronic component.

2. The electronic device of claim 1, further comprising:
   a noise reduction member contacting at least a portion of a second surface of the shielding member, the noise reduction member being configured to reduce audible noise caused from the first electronic component or the second electronic component.

3. The electronic device of claim 1, wherein the electronic device further comprises:
   a heat transfer member disposed in the first opening, the heat transfer member having a second surface coupled to at least a second portion of the first surface of the shielding member different from the first portion of the first surface of the shielding member.

4. The electronic device of claim 2, wherein the noise reduction member comprises a second opening overlapping at least a portion of the first electronic component.

5. The electronic device of claim 1,
   wherein the printed circuit board comprises a ground part formed along at least a portion of a peripheral area of the first electronic component or the second electronic component, and
   wherein the ground part is coupled to an end surface of the shielding member.

6. The electronic device of claim 1,
   wherein the shielding member has a first thickness,
   wherein the first thermal diffusion member has a second thickness, and
   wherein the second thickness is thicker than the first thickness.

7. The electronic device of claim 2, wherein the noise reduction member comprises a non-conductive material configured to absorb the audible noise.

8. The electronic device of claim 2, wherein the noise reduction member comprises a conductive material configured to reflect and block the audible noise.

9. The electronic device of claim 8, further comprising:
   an insulation member is-disposed on a second surface of the noise reduction member, in case the noise reduction member comprises the conductive material.

10. The electronic device of claim 3, further comprising:
    a second thermal diffusion member disposed in a first direction from the heat transfer member.

11. The electronic device of claim 10, further comprising:
    a third thermal diffusion member disposed in the first direction from the second thermal diffusion member while having an air gap therebetween; and
    a rear plate disposed in the first direction from the third thermal diffusion member.

12. The electronic device of claim 1, wherein the shielding member comprises a conductive fiber sheet, a copper (Cu) sheet, or an aluminum (Al) sheet.

13. The electronic device of claim 1,
    wherein the first electronic component comprises a processor or a power management integrated circuit (PMIC), and
    wherein the second electronic component comprises at least one capacitor.

14. An electronic device comprising:
    a housing;
    a printed circuit board disposed in the housing;

a first electronic component and a second electronic component disposed on the printed circuit board;

a shielding member encapsulating the first electronic component and the second electronic component on the printed circuit board;

a first thermal diffusion member contacting at least a first portion of a first surface of the shielding member and comprising a first opening overlapping at least a portion of the first electronic component; and an insulation member surrounding at least a portion of a second surface of the shielding member.

15. The electronic device of claim 14, wherein the insulation member comprises a second opening overlapping at least the portion of the first electronic component, and wherein the electronic device further comprises:

a heat transfer member disposed in the first opening such that a second surface of the heat transfer member is coupled to at least a second portion of the first surface of the shielding member different from the first portion of the first surface of the shielding member.

16. The electronic device of claim 15, further comprising:

a second thermal diffusion member disposed in a first direction from the heat transfer member; and a third thermal diffusion member disposed in the first direction from the second thermal diffusion member while having an air gap therebetween; and a rear plate disposed in the first direction from the third thermal diffusion member.

17. An electronic device comprising:

a housing;

a printed circuit board disposed in the housing;

a first electronic component and a second electronic component disposed on the printed circuit board;

a shielding member encapsulating the first electronic component and the second electronic component on the printed circuit board; and a noise reduction member contacting at least a portion of a second surface of the shielding member and being configured to reduce audible noise caused from the first electronic component or the second electronic component, the noise reduction member comprising a first opening overlapping at least a portion of the first electronic component.

18. The electronic device of claim 17, further comprising:

an insulation member surrounding at least a first portion of a first surface of the shielding member and having a second opening overlapping at least the portion of the first electronic component.

19. The electronic device of claim 18, further comprising:

a heat transfer member disposed in the first opening such that a second surface of the heat transfer member is coupled to at least a second portion of the first surface of the shielding member different from the first portion of the first surface of the shielding member.

\* \* \* \* \*